United States Patent [19]
Chun et al.

[11] Patent Number: 5,870,290
[45] Date of Patent: Feb. 9, 1999

[54] INTERFACE ADAPTER BOARD HAVING ARRAYS OF INTERSTITIAL CONNECTORS AND AN INTERMEDIATE SWITCHING CIRCUIT

[75] Inventors: Collier S.C. Chun; Tom M. Skoric, both of Beaverton, Oreg.

[73] Assignee: Intel Corporation, Santa Clara, Calif.

[21] Appl. No.: 909,395

[22] Filed: Aug. 11, 1997

Related U.S. Application Data

[63] Continuation of Ser. No. 698,184, Aug. 15, 1996, abandoned, which is a continuation of Ser. No. 346,683, Nov. 30, 1994, abandoned.

[51] Int. Cl.$^6$ .................................................. H01R 23/68
[52] U.S. Cl. ........................................ 361/790; 361/686
[58] Field of Search .................................. 361/790, 686; 439/48; 711/114

[56] References Cited

U.S. PATENT DOCUMENTS

| | | | |
|---|---|---|---|
| 5,257,166 | 10/1993 | Marui et al. | 361/760 |
| 5,261,115 | 11/1993 | Saunders et al. | 395/800 |
| 5,303,121 | 4/1994 | Thornberg | 361/760 |
| 5,355,105 | 10/1994 | Angelucci, Sr. | 333/238 |
| 5,376,825 | 12/1994 | Tukamoto et al. | 257/685 |
| 5,384,692 | 1/1995 | Jaff | 361/807 |
| 5,406,025 | 4/1995 | Carlstedt | 174/17.08 |
| 5,455,740 | 10/1995 | Burns | 361/735 |
| 5,485,585 | 1/1996 | Huynh et al. | 395/311 |

OTHER PUBLICATIONS

1994 Intel Packaging Handbook (Order #240800;ISBN #1–55512–208–6), pp. 2–36 to 2–37 and 11–1 to 11–2.

Primary Examiner—Tod R. Swann
Assistant Examiner—David Caugjahr
Attorney, Agent, or Firm—Blakely, Sokoloff, Taylor & Zafman

[57] ABSTRACT

An interface adapter board according to the present invention can be inserted directly between two electronic parts without substantially displacing the electronic parts laterally. An electronic circuit board may include: (a) a first electronic part having a first array of conductors; (b) a second electronic part having a second array of conductors; and (c) an interface adapter board placed between the first and second electronic parts in such a way to minimize the lateral distance between each conductor of the first array and its respective conductor of the second array. The interface adapter board has a third array of conductors and a fourth array of conductors formed through the interface adapter board and positioned in an interstitial relationship with the third array of conductors. Each conductor of the first array is coupled to its respective conductor of the third array. A first set of conductors of the third array is directly coupled to its respective set of conductors of the fourth array. A second set of conductors of the third array is coupled to its respective set of conductors of the fourth array through an intermediate circuit so that the signals carried by the second set of conductors of the third array are different from the signals carried by its respective set of conductors of the fourth array. Each conductor of the fourth array is coupled to its respective conductor of the second array.

21 Claims, 5 Drawing Sheets

5,870,290

INTERFACE ADAPTER BOARD HAVING ARRAYS OF INTERSTITIAL CONNECTORS AND AN INTERMEDIATE SWITCHING CIRCUIT

This is a continuation of application Ser. No. 08/698,184, filed Aug. 15, 1996, now abandoned, which is a continuation of application Ser. No. 08/346,683, filed Nov. 30, 1994 now abandoned.

BACKGROUND OF THE INVENTION

1. Field of the Invention

The present invention relates to the field of printed circuit boards, connectors and chip packaging technologies.

2. Description of the Background

In FIG. 1a, a printed circuit board (PCB) such as a motherboard 10 carries many different components (12–54). A component placed on motherboard 10 may be an integrated circuit chip or a discrete component. Because motherboard 10 supplies signals having certain characteristics and specifications, the components that can be inserted onto motherboard 10 must meet the specifications. A component that does not meet the specifications cannot be inserted directly onto motherboard 10. For instance, motherboard 10 used in a computer typically provides power supply voltages between 4.75 V to 5.25 V. Suppose that component 24 includes a processor that runs at high speed such as a 66 MHz (PENTIUM) processor. For component 24 to be inserted directly onto motherboard 10, it must be able to operate using power supply voltages between 4.75 V and 5.25 V. However, if the processor requires different power supply voltages (e.g., 4.9 V to 5.4 V, 5.15 V to 5.4 V or 3.0 to 3.3 V) due to manufacturing process variations or design changes, it cannot be inserted onto motherboard 10.

There are two possible solutions. First, motherboard 10 can be redesigned with a separate power distribution trace for the processor. There are several disadvantages to this approach. One is the cost. Redesigning an entire motherboard that is to be used with many components is very costly. Also, it may be too time consuming. It may take a considerable amount of time to redesign the motherboard. In addition, a motherboard used for a computer typically requires an FCC certification. If the motherboard is redesigned, it may also need an FCC re-certification.

Second, instead of redesigning the entire board, an interface adapter board may be employed. One advantage of having an interface adapter board is that it would not require an FCC re-certification. A prior art interface adapter board 55 may have a switching power supply converter 56, component 24, an array of connectors 57 and long metal traces 58. Switching power supply converter 56 converts power supply voltages from one range to another range that is compatible with component 24. When component 24 has an array of pin connectors (such as pins 72 in FIG. 4a), component 24 needs to be displaced laterally at least by the size of the array of the pin connectors. When a conventional connector technology is used, component 24 is connected to motherboard 10 through long metal traces 58 (not all are shown) and array of connectors 57. This solution, however, is not acceptable when the operating speed of component 24 is high (e.g., 66 MHz). For a high speed component, the interface adapter board must be designed to minimize the amount of adverse effect it has on the timing of the signals and the transmission line characteristics of component 24 and motherboard 10.

SUMMARY OF THE INVENTION

The present invention provides an interface adapter board that can be inserted directly between two electronic parts without substantially displacing the electronic parts laterally. The interface adapter board includes an interstitial array of conductors and an intermediate circuit. While one set of the conductors on the interface adapter board is used to carry signals between the two electronic parts without modification, another set of the conductors carries signals that are modified by the intermediate circuit.

The present invention provides an electronic circuit board including: (a) a first electronic part having a first array of conductors; (b) a second electronic part having a second array of conductors; and (c) an interface adapter board placed between the first and second electronic parts in such a way to minimize the lateral distance between each conductor of the first array and its respective conductor of the second array.

The interface adapter board has a third array of conductors and a fourth array of conductors formed through the interface adapter board and positioned in an interstitial relationship with the third array of conductors. Each conductor of the first array is coupled to its respective conductor of the third array. A first set of conductors of the third array is directly coupled to its respective set of conductors of the fourth array. A second set of conductors of the third array is coupled to its respective set of conductors of the fourth array through an intermediate circuit so that the signals carried by the second set of conductors of the third array are different from the signals carried by its respective set of conductors of the fourth array. Each conductor of the fourth array is coupled to its respective conductor of the second array.

In one embodiment of the present invention, the first electronic part is a semiconductor chip package having a microprocessor, the second electronic part is a printed circuit board being a motherboard, and the interface adapter board is a voltage regulating adapter board. The first array of conductors includes pin grid array (PGA) pins, the second array of conductors includes PGA sockets, the third array of conductors includes PGA sockets, and the fourth array of conductors includes PGA pins. The first set of conductors of the third array carries signals that are communicated between the microprocessor and the motherboard without being modified.

In the above mentioned embodiment, the intermediate circuit is a switching power supply converter which converts DC power supply voltages. The switching power supply converter translates the power supply voltage range of the motherboard into another voltage range that can be used by the microprocessor. Because the third and the fourth arrays of conductors are in an interstitial relationship, the interface adapter board adds in each electrical path approximately a ¼" long metal trace having about 40 pico seconds in delay.

DETAILED DESCRIPTION OF THE INVENTION

In the following description, numerous specific details are set forth to provide a thorough understanding of the present invention. It will be obvious, however, to one skilled in the art that the present invention may be practiced without these specific details. In other instances, well-known circuits, devices, structures and techniques are not shown in detail not to unnecessarily obscure the present invention.

The present invention provides an interface adapter board that uses interstitial arrays of conductors to reduce the amount of trace added and thereby to minimize the amount of adverse effect on the signals that communicate through the interface adapter board. The interface adapter board is inserted between two electronic parts wherein the lateral placement of the first electronic part with respect to the second electronic part is substantially the same with or without the interface adapter board.

Figure 1A:
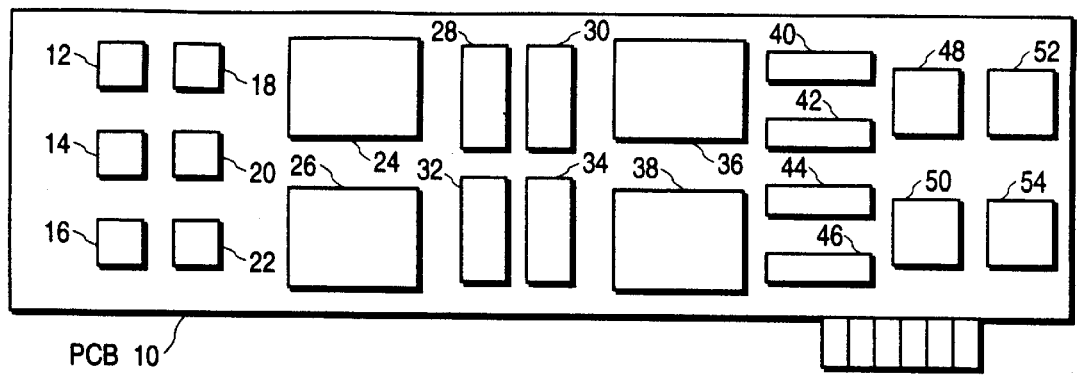
FIG. 1a is a prior art printed circuit board having various electronic components.
Figure 1B:
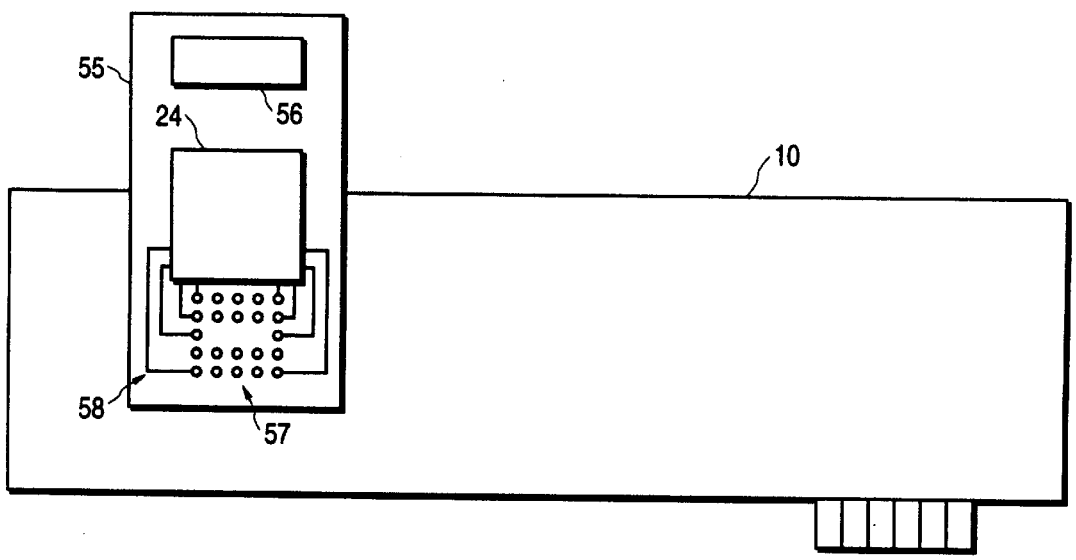
FIG. 1b is a prior art printed circuit board having an interface adapter board.
Figure 2:
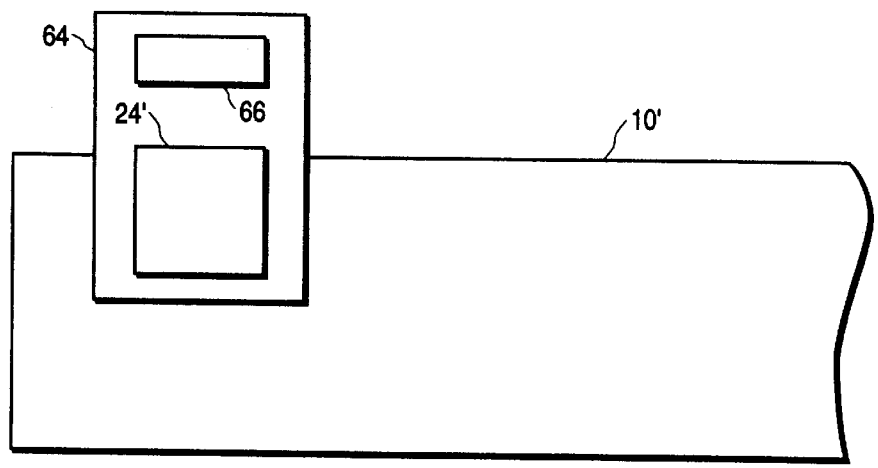
FIG. 2 is an electronic circuit board having a chip package, a printed circuit board (PCB) and an interface adapter board placed between the chip package and the PCB according to the present invention.

Now referring to FIG. 2, an electronic circuit board having a first electronic part 24', a second electronic part 10' and an interface adapter board 64 is presented. First electronic part 24' may be a semiconductor chip package or a printed circuit board (PCB). A semiconductor chip package may include, but not limited to, a microprocessor and/or a memory. A PCB may include various electronic components. Second electronic part 10' may be a printed circuit board such as the one shown in FIG. 1 having many electronic components.

Interface adapter board 64 includes an interstitial array of conductors to be placed directly below first electronic part 24'. Some of the conductors are directly coupled between first electronic part 24' and second electronic part 10' while some of the other conductors are coupled between first electronic part 24' and second electronic part 10' through an intermediate circuit 66.

A first set of signals that is compatible with both parts 24' and 10' is directly coupled to the first and second electronic parts. The first set of signals is carried through the interstitial conductor paths provided in interface adapter board 64 to minimize time delay and any adverse effect on the transmission line characteristics. The first set of signals typically includes high speed signals.

A second set of signals that is either not compatible with first electronic part 24' or second electronic part 10' is passed through intermediate circuit 66 so that it can be conditioned to become compatible with both first and second electronic parts (24' and 10'). The second set of signals is typically not speed critical (e.g., DC signals). Thus, interface adapter board 64 of the present invention is useful where some signals need to be directly coupled between the two parts while other signals need to be processed or modified before they are communicated from one part to another. Intermediate circuit 66 can be a signal processing or signal modifying circuit including, but not limited to, voltage conversion circuit, a voltage shifting circuit, and a voltage clamping circuit.

Figure 3A:
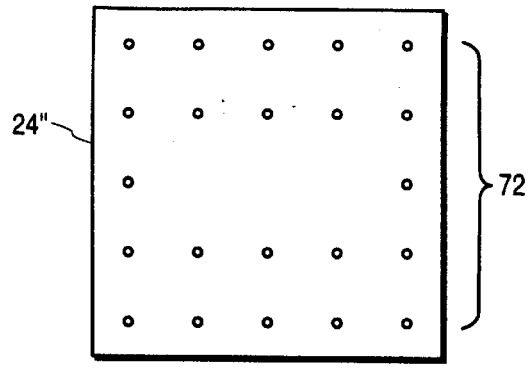
FIG. 3a is a bottom plan view of the chip package in FIG. 2 according to one embodiment of the present invention.

Now referring to FIGS. 3a–4c, in one embodiment of the present invention, first electronic part 24' is a microprocessor chip package 24", interface adapter board 64 is a voltage regulating adapter board 64", and second electronic part 10' is a motherboard 10". FIG. 3a is a bottom plan view of microprocessor chip package 24". Microprocessor chip package 24" includes a plurality of pin grid array (PGA) pins 72 as connectors. Microprocessor chip package 24" may include a (PENTIUM) processor operating at 66 MHz or higher. While microprocessor chip package 24" is about 2.1"×2.1" in area, it contains high density PGA pins. There may be 270 or more pins, and the spacing between the pins are typically 0.1 inches. A cross-sectional view of microprocessor chip package 24" is shown in FIG. 4a. PGA pins 72 form a first array of conductors for microprocessor package 24".

Figure 3B:
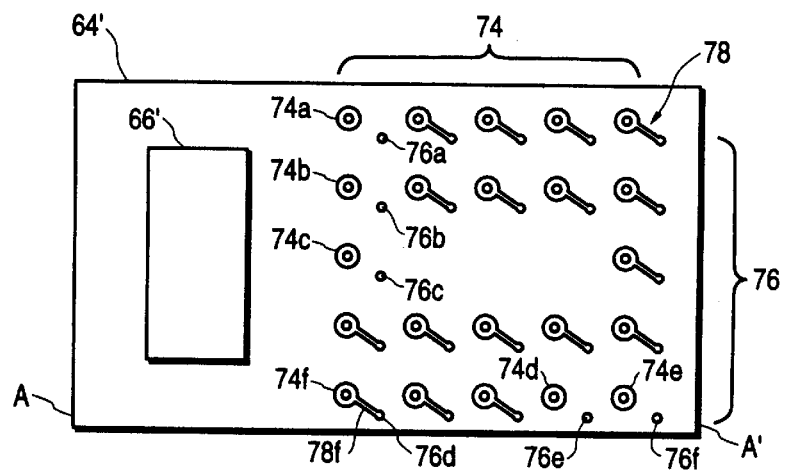
FIG. 3b is a top plan view of the interface adapter board shown in FIG. 2 according to one embodiment of the present invention.

FIG. 3b shows voltage regulating adapter board 64. Voltage regulating adapter board 64' includes a switching power supply converter 66', a second array of conductors 74 and a third array of conductors 76. Conductors 74 are PGA sockets while conductors 76 are PGA pins. Second array of conductors 74 and third array of conductors 76 together form an interstitial array of conductors. Some conductors (or sockets) of the second array are coupled to their respective conductors (or pins) of the third array through metal traces 78. For instance, a socket 74f is connected to a pin 76f through a metal trace 78f. The sockets and pins having metal traces between them are used to connect microprocessor chip package 24" directly to motherboard 10". A socket-to-metal trace-to-pin path is approximately ¼" long and produces approximately 40 pico seconds in delay, causing a minimal impact on the critical processor/cache interface timing.

Figure 3C:
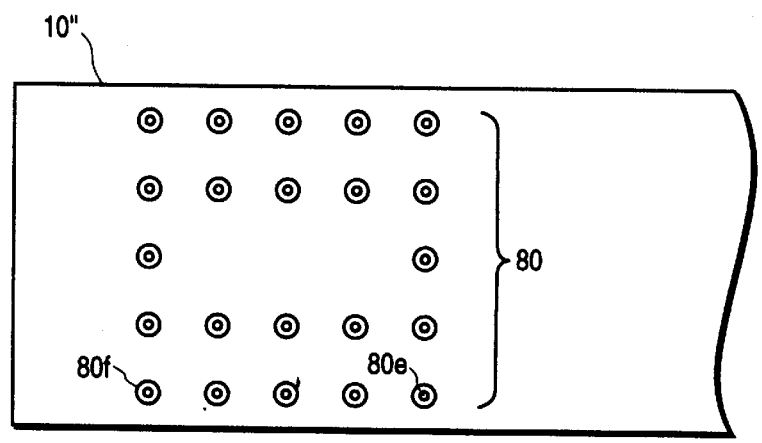
FIG. 3c is a top plan view of the printed circuit board in FIG. 2 according to one embodiment of the present invention.

In this first embodiment, conductors (or sockets) 74a–74e and conductors (or pins) 76a–76e are used to carry power. For instance, while motherboard 10" provides power supply voltages between 4.75 V to 5.25 V, microprocessor chip package 24" may require power supply voltages between 5.15 V to 5.4 V. In that instance, while pins 76a–76e are used to bring in power supply voltages between 4.75–5.25 V, sockets 74a–74e are used to carry power supply voltages between 5.15–5.4 V to the microprocessor in microprocessor chip package 24". Switching power supply converter 66' is used to convert power supply voltages in the range of 4.75–5.25 V to 5.15–5.4 V. FIG. 3c is the top plan view of motherboard 10". It includes an array of conductors 80 that are PGA sockets to receive the third array of conductors 76 from voltage regulating adapter board 64'.

Figure 5A:
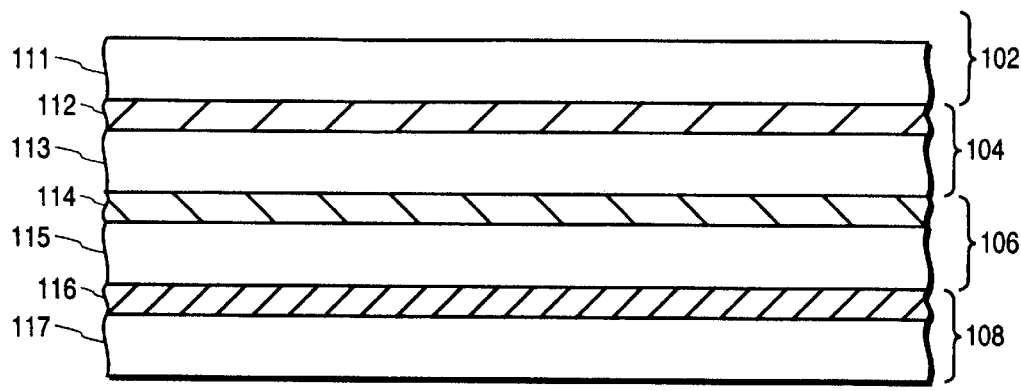
FIG. 5a is a cross-sectional view of the interface adapter board along A–A' in FIG. 3b.

FIG. 5a shows a cross-sectional view of voltage regulating adapter board in FIG. 3b 64' along A–A'. Referring to FIG. 5a, voltage regulating adapter board 64 includes four layers: a signal plane 102, two power planes 104 and 106, and a ground plane 108. Metal traces 78 in FIG. 3b are disposed on signal plane 102. Power plane 104 typically includes a metal layer 112. In this example, metal layer 112 carries power supply voltages in the range of 5.15–5.4 V. Power plane 106 includes a metal layer 114 that carries power supply voltages in the range of 4.75–5.25 V. Pins 76a–76e are connected to metal layer 114 while sockets 74a–74e are connected to metal layer 112. Switching power supply converter 66' is coupled to metal layers 112 and 116. Metal layers are typically copper.

Figure 4A:
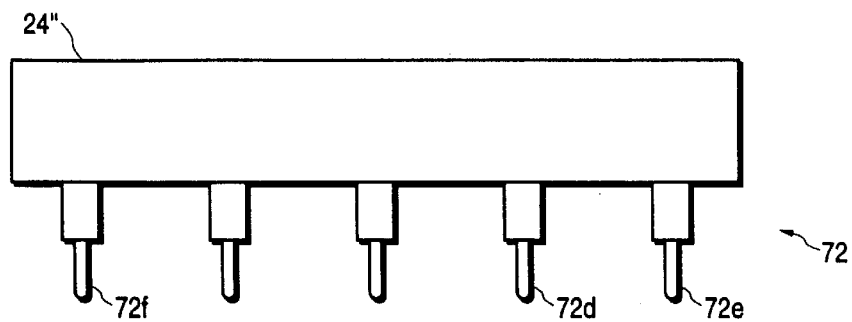
FIG. 4a is an elevation view of the chip package of FIG. 2.
Figure 4B:
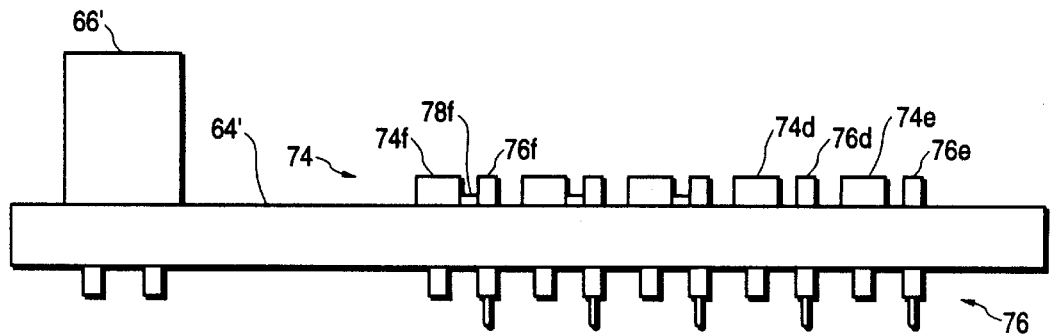
FIG. 4b is an elevation view of the interface adapter board of FIG. 2.
Figure 4C:
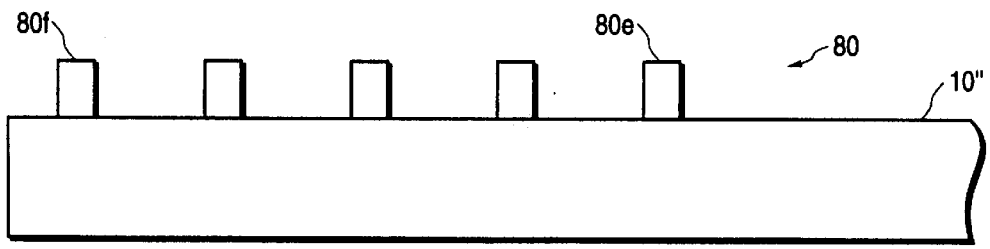
FIG. 4c is an elevation view of the printed circuit board of FIG. 2.

FIGS. 4a–4c show the elevation view of those parts that are shown in FIGS. 3a–3c. As shown in FIGS. 4a–4c, to directly connect a signal from microprocessor chip package 24" to motherboard 10", a pin 72f mates with a socket 74f in voltage regulating adapter board 64'. A metal trace 78f connects pin 74f to PGA pin 76f. Pin 76f, in turn, is mated with a socket 80f in motherboard 10". To connect a signal from motherboard 10" to microprocessor chip package 24" through switching power supply converter 66', a socket 80e on motherboard 10" is connected to a pin 76e in voltage regulating adapter board 64'. Pin 76e carries the DC power supply voltage (e.g., 4.75–5.25 V) to metal layer 114 in FIG. 5a. Metal layer 114, in turn, provides the DC power supply voltage to switching power supply converter 66'. After switching power supply converter 66' converts the power supply voltage of metal layer 114 into a second power supply voltage, the second power supply voltage (e.g., 5.15–5.4 V) is sent to metal layer 112. A socket 74e is connected to metal layer 112 to receive the second power supply voltage. Pin 72e in microprocessor chip package 24" mates with socket 74e to carry the second power supply voltage to the microprocessor which is in microprocessor chip package 24".

Referring to FIGS. 4b and 5a, various methods may be employed to make voltage regulating adapter board 64'. According to one method, first, four layers (102, 104, 106 and 108) each including a metal layer and a dielectric layer are formed. A typical PCB technology using lamination and plating techniques can be employed. Layers 111, 113, 115 and 117 are dielectric layers, and layers 112, 114 and 116 are metal layers. Second, holes can be punched out according to the second and third array pattern.

Third, sockets 74 and pins 76 can be press fitted into board 64'. Sockets 74 and pins 76 can be purchased from a vendor such as Mill-Max in New York. According to one embodiment, each socket 74 and pin 76 can be individually pressed fitted into board 64'. The part number of Mill-Max for each socket 74 is 0553-2-15-01-21-27-10-0, and the part number for each pin 76 is 9553-0-15-15-21-00-04-0. In another embodiment, sockets 74 and pins 76 can be put on a carrier. When sockets 74 are on a carrier, they are in a pattern that matches the second array pattern on board 64'. Pins 76 that are on a carrier are in a pattern that matches the third array pattern. The part number of Mill-Max for a carrier having an array of sockets 74 is S691-00-000-00-601000, and the part number for a carrier having an array of pins 76 is S691-00-000-00-602000. Because the pins and sockets are on a carrier matching the array pattern on board 64', they can be easily press-fitted into the board.

Fourth, switching power supply converter 64' which can be purchased from a vendor such as Linear Technology is soldered onto board 64'. Other components such as discrete capacitors can be mounted on board 64' using a surface mount technology or a traditional through-hole solder technology. Board 64' may also include a 5 V DC power connector for a heat sink mounted fan to cool microprocessor chip package 24".

Referring to FIGS. 4a–4c, to assemble microprocessor chip package 24", voltage regulating adapter board 64' and motherboard 10", voltage regulating adapter board 64' is aligned to motherboards 10", and pins 76 in voltage regulating adapter board 64' are pushed into sockets 80 in motherboard 10'. Pins 76 are held in sockets 80 by friction without solder. Then microprocessor chip package 24" is placed above voltage regulating adapter board 64', and the pins 72 are pressed into sockets 74 so that pins 72 can be held in sockets 74 by friction without solder. Each of pins 72 and sockets 74 is held together using approximately 0.3–1.0 ounce of force, and each of pins 76 and sockets 80 is also held together using approximately 0.3–1.0 ounce of force.

It should be noted that while the spacing between the sockets 74 are approximately 0.1", the spacing between the pins 76 are also 0.1". However, the spacing between each of the sockets 74 and its respective one of pins 76 is approximately 0.071".

Figure 5B:
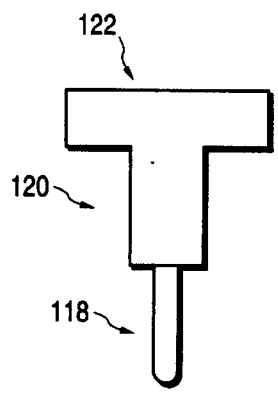
FIG. 5b is a cross-sectional view of a pin grid array pin.

FIG. 5b shows a PGA pin 122. PGA pin 122 includes a socket 120 and a pin 118. Each of sockets 74 in FIG. 4b includes a socket 120 shown in FIG. 5b. Each of pins 76 includes a socket 120 and a pin 118 shown in FIG. 5b.

Figure 6:
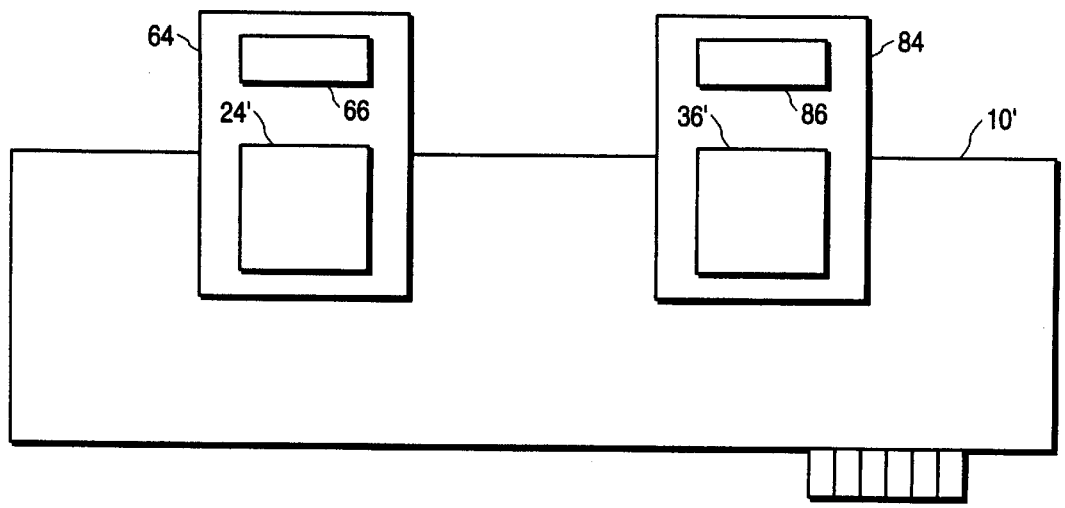
FIG. 6 is an electronic circuit board having a plurality of interface adapter boards.

It should be noted that motherboard 10' may include more than one interface adapter boards as shown in FIG. 6. Each of the interface adapter boards (64 and 84) contains an intermediate circuit (66 or 86) and is coupled to an electronic part (24' or 36') and motherboard 10'. An interface adapter board may contain one or more intermediate circuits and one or more electronic parts.

Figure 7A:
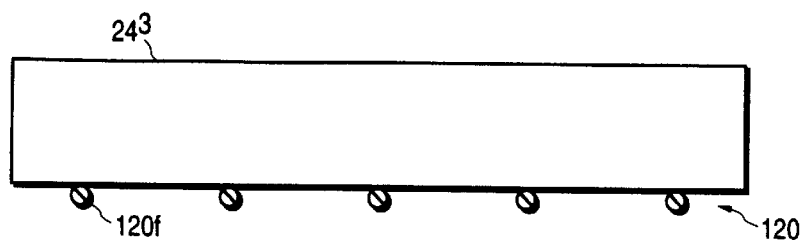
FIG. 7a is an elevation view of a chip package according to the second embodiment of the present invention.
Figure 7B:
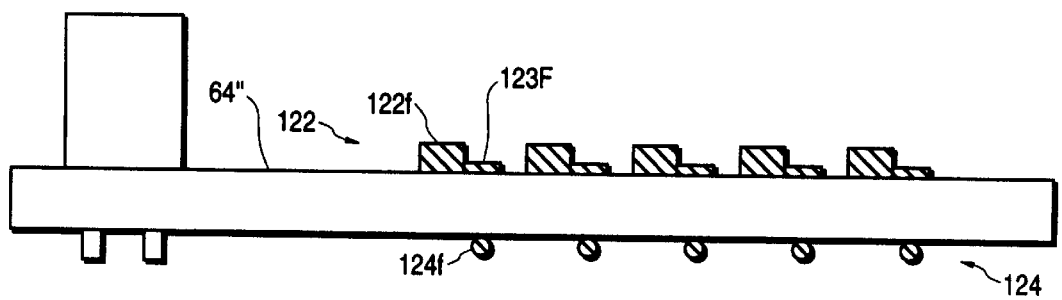
FIG. 7b is an elevation view of an interface adapter board according to the second embodiment of the present invention.
Figure 7C:
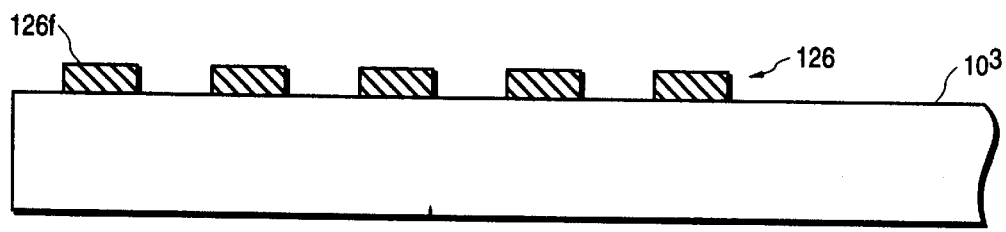
FIG. 7c is an elevation view of a printed circuit board according to the second embodiment of the present invention.

Now referring to FIGS. 7a–7c, in another embodiment of the present invention, an electronic circuit board includes a microprocessor chip package 24$^3$, a voltage regulating adapter board 64", and a motherboard 10$^3$. Microprocessor chip package 24$^3$ includes a first array of conductors including ball grid array (BGA) contacts 120. A BGA contact includes a contact pad and a solder ball. Voltage regulating adapter board 64" includes a second array of conductors that are plated contacts 122 and a third array of conductors that are plated-through conductors (not shown) and BGA contacts 124. Motherboard 10$^3$ includes a fourth array of conductors that are plated contacts 126. PGA contacts 120 are matable with plated contacts 122, and PGA contacts 124 are matable with plated contacts 126. To assemble microprocessor chip package 24$^3$, voltage regulating adapter board 64" and motherboard 10$^3$, voltage regulating adapter board 64" will be first put into contact with motherboard 10$^3$, and an appropriate temperature is applied to flow the solder and make permanent connection between the two arrays of conductors. Then microprocessor chip package 24$^3$ will come into contact with voltage regulating adapter board 64". Again an appropriate temperature is applied to flow the solder. To make a connection between a BGA contact 120f and a plated contact 126f, BGA contact 120f is connected to plated contact 122f which is connected to a metal trace 123f. Metal trace 123f is then connected to a BGA contact 124f through a plated-through conductor (not shown), and finally BGA contact 124f is connected to plated contact 126f. The physical dimensions (e.g., spacing between the contacts) and the electrical characteristics of the electronic circuit board in FIG. 7a–7c may be similar to those of the electronic circuit board shown in FIGS. 4a–4c.

It should be noted that in yet another embodiment, the first array of conductors includes plated contacts, the second array of conductors includes BGA contacts, the third array of conductors includes plated contacts, and the fourth array of conductors includes BGA contacts.

Referring to FIG. 8, a computer system may utilize an electronic circuit board in accordance with the present invention. A computer host 1000 includes a memory 1008 and a central processor 1002. These elements are those typically found in most general purpose computers and almost all special purpose computers. In fact, these devices contained within computer host 1000 are intended to be representative of the broad category of data processors and memory. Many commercially available computers having differing capabilities may be utilized which incorporate the present invention. An electronic circuit board of the present invention may be a motherboard having at least one of central processor 1002 and/or memory 1008 on an interface adapter card of the present invention.

A system bus 1016 is provided for communicating information. A display device 1010 utilized with the computer system of the present invention may be a liquid crystal device, cathode ray tube or other display device suitable for creating graphic images and/or alphanumeric characters recognizable to a user. The computer system may also include an alphanumeric input device 102 including alphanumeric and function keys coupled to bus 1016 for communicating information and command selections to central processor 1002, and a cursor control device 1018 coupled to bus 1016 for communicating user input information and command selections to central processor 1002 based on a user's hand movement. Cursor control device 1018 allows a network user to dynamically signal the two-dimensional movement of the visual symbol (pointer) on a display screen of display device 1010. Many implementations of cursor control device 1018 are known in the art, including a track ball, mouse, joystick or special keys on the alphanumeric input device 1012, all capable of signaling movement in a given direction or manner of displacement.

The computer system of FIG. 8 also includes an interface device 1019 coupled to bus 1016 for communicating information to and from the computer system. Interface device 1019 may be coupled to a communication modem, a network system, other memory devices, other computers, etc. An interface adapter board of the present invention may be inserted between interface device 1019 and one of the communication modem and other memory devices. Also available for interface with the computer system of the present invention is a data storage device 1017 such as a magnetic disk or optical disk drive, which may be communicatively coupled with bus 1016, for storing date and instructions. The computer system of FIG. 8 may also include a printer 1014 for outputting data.

While the present invention has been particularly described with reference to the various figures and embodiment, it should be understood that these are for illustration only and should not be taken as limiting the scope of the invention. Many changes and modifications may be made to the invention, by one having ordinary skill in the art, without departing from the spirit and scope of the invention.

What is claimed is:

1. An electronic circuit board comprising:
    a first electronic part having a first array of conductors;
    a second electronic part having a second array of conductors; and
    an interface adapter board placed between said first and second electronic parts, said interface adapter board minimizing the lateral displacement between said first array of conductors and said second array of conductors by having interstitial connectors and including:
    an intermediate switching circuit;
    a third array of conductors; and
    a fourth array of conductors formed through said interface adapter board and positioned in an interstitial relationship with said third array of conductors to create said interstitial connectors, at least one conductor of said third array being coupled to its respective one of said fourth array through said intermediate switching circuit wherein said intermediate switching circuit performs automatic modifications to output from said third array, each conductor of said fourth array for coupling to its respective conductor of said second array.

2. An electronic circuit board according to claim 1 wherein said first electronic part is a semiconductor chip package, said interface adapter board is a first printed circuit board (PCB), and said second electronic part is a second PCB.

3. An electronic circuit board according to claim 1 wherein said first array of conductors includes pin grid array (PGA) pins, said second array of conductors includes PGA sockets, said third array of conductors includes PGA sockets, and said fourth array of conductors includes PGA pins.

4. An electronic circuit board according to claim 3 wherein said sockets of said third array of conductors are densely populated so that the spacing between said sockets of said third array of conductors is not greater than 0.1 inches, said pins of said fourth array of conductors are densely populated so that the spacing between said pins of said fourth array of conductors is not greater than 0.1 inches
    wherein the spacing between each of said sockets of said third array of conductors and its respective one of said pins of said fourth array of conductors is not greater than 0.071 inches, and the lateral distance between each conductor of said first array and its respective conductor of said second array is less than 0.1 inches.

5. An electronic circuit board according to claim 3 wherein said sockets of said third array of conductors are press-fitted into said interface adapter board, and said pins of said fourth array of conductors are press-fitted into said interface adapter board;
    wherein each of said pins of said first array of conductors is held in its respective one of said sockets of said third array of conductors by friction and each of said pins of said fourth array of conductors is held in its respective one of said sockets of said second array of conductors by friction.

6. An electronic circuit board according to claim 5 wherein each of said pins of said first array of conductors is held in its respective one of said sockets of said third array of conductors using approximately 0.3–1.0 ounce of force, and each of said pins of said fourth array of conductors is held in its respective one of said sockets of said second array of conductors using approximately 0.3–1.0 ounce of force.

7. An electronic circuit board according to claim 1 wherein said first array of conductors includes ball grid array (BGA) contacts, said second array of conductors includes a first plurality of plated contacts, said third array of conductors includes a second plurality of plated contacts, and said fourth array of conductors includes plated-through conductors and BGA contacts.

8. An electronic circuit board according to claim 1 wherein said intermediate switching circuit includes a switching power supply converter
    wherein said first signal is a first DC power supply voltage, and said second signal is a second DC power supply voltage
    wherein while said second electronic part operates at said second DC power supply voltage, said first electronic part operates at said first DC power supply voltage wherein said switching power supply converter converts said second signal into said first signal.

9. An electronic circuit board according to claim 1 wherein said first electronic part is a first printed circuit board (PCB), said interface adapter board is a second PCB, and said second electronic part is a third PCB.

10. An electronic circuit board according to claim 1 wherein an electrical path between a conductor of said first array coupled to one of said plurality of conductors of said third array and its respective conductor of said second array is approximately ¼" long and adds approximately 40 pico seconds in delay.

11. An interface adapter board for placement between a first electronic part and a second electronic part, said interface adapter board having interstitial connectors for minimizing the lateral displacement between said first electronic part and said second electronic part, said interface adapter board comprising:
   an intermediate switching circuit;
   a first array of conductors; and
   a second array of conductors formed through said interface adapter board positioned in an interstitial relationship with said first array of conductors to create said interstitial connectors, a plurality of conductors of said first array being coupled to their respective ones of said second array of conductors, at least one conductor of said first array being coupled to its respective one of said second array through said intermediate switching circuit wherein said intermediate switching circuit performs automatic modifications to output from said first array.

12. The interface adapter board according to claim 11 wherein said interface adapter board is a printed circuit board (PCB).

13. The interface adapter board according to claim 11 wherein said first array of conductors includes pin grid array (PGA) sockets, and said second array of conductors includes PGA pins.

14. The interface adapter board according to claim 13 wherein said sockets of said first array of conductors are densely populated so that the spacing between said sockets of said first array of conductors is not greater than 0.1 inches, said pins of said second array of conductors are densely populated so that the spacing between said pins of said second array of conductors is not greater than 0.1 inches, and the spacing between each of said sockets of said first array of conductors and its respective one of said pins of said second array of conductors is not greater than 0.071 inches.

15. The interface adapter board according to claim 11 wherein said first array of conductors includes a plurality of plated contacts, and said second array of conductors includes plated-through conductors and ball grid array (BGA).

16. The interface adapter board according to claim 11 wherein said intermediate switching circuit includes a switching power supply converter
   wherein said first signal is a first DC power supply voltage, and said second signal is a second DC power supply voltage
   wherein while said second electronic part operates at said second DC power supply voltage, said first electronic part operates at said first DC power supply voltage wherein said switching power supply converter converts said second signal into said first signal.

17. The interface adapter board according to claim 11 wherein an electrical path between a conductor of said first array coupled to one of said plurality of conductors of said second array and its respective conductor of said second array is approximately ¼" long and adds approximately 40 pico seconds in delay.

18. A computer system comprising:
   a memory for storing an instruction;
   a system bus coupled to said memory to provide a data communication path for said computer system; and
   an electronic circuit board coupled to said system bus including:
      a first electronic part having a first array of conductors;
      a second electronic part having a second array of conductors; and
      an interface adapter board placed between said first and second electronic parts, said interface adapter board minimizing the lateral displacement between said first array of conductors and said second array of conductors by having interstitial connectors and including:
         an intermediate switching circuit;
         a third array of conductors; and
         a fourth array of conductors formed through said interface adapter board and positioned in an interstitial relationship with said third array of conductors to create said interstitial connectors, each conductor of said first array for coupling to its respective conductor of said third array, a plurality of conductors of said third array being coupled to their respective ones of said fourth array of conductors, at least one conductor of said third array being coupled to its respective one of said fourth array through said intermediate switching circuit wherein said intermediate switching circuit performs automatic modifications to output from said third array, each conductor of said fourth array for coupling to its respective conductor of said second array.

19. A computer system according to claim 18 wherein said first electronic part is a chip package including a process, said second electronic part is first printed circuit board (PCB) being a motherboard, said interface adapter board is a second PCB, and said memory is on said electronic circuit board.

20. A computer system according to claim 18
   wherein said first array of conductors includes pin grid array (PGA) pins, said second array of conductors includes PGA sockets, said third array of conductors includes PGA sockets, and said fourth array of conductors includes PGA pins
   wherein said sockets of said third array of conductors are densely populated so that the spacing between said sockets of said third array of conductors is not greater than 0.1 inches, said pins of said fourth array of conductors are densely populated so that the spacing between said pins of said fourth array of conductors is not greater than 0.1 inches
   wherein the spacing between each of said sockets of said third array of conductors and its respective one of said pins of said fourth array of conductors is not greater than 0.071 inches, and the lateral distance between each conductor of said first array and its respective conductor of said second array is less than 0.1 inches.

21. A computer system according to claim 18 wherein said intermediate switching circuit includes a switching power supply converter wherein said first signal is a first DC power supply voltage, and said second signal is a second DC power supply voltage wherein while said second electronic part operates at said second DC power supply voltage, said first electronic part operates at said first DC power supply voltage wherein said switching power supply converter converts said second signal into said first signal wherein an electrical path between a conductor of said first array coupled to one of said plurality of conductors of said third array and its respective conductor of said second array is approximately ¼" long and adds approximately 40 pico seconds in delay.

* * * * *